United States Patent
Park

(10) Patent No.: US 8,209,652 B2
(45) Date of Patent: Jun. 26, 2012

(54) SEMICONDUCTOR DEVICE AND LAYOUT METHOD OF DECOUPLING CAPACITOR THEREOF

(75) Inventor: Jong-Wook Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 1175 days.

(21) Appl. No.: 12/069,316

(22) Filed: Feb. 8, 2008

(65) Prior Publication Data

US 2008/0203436 A1  Aug. 28, 2008

(30) Foreign Application Priority Data

Feb. 23, 2007  (KR) ........................ 10-2007-0018441

(51) Int. Cl.
*G06F 17/50* (2006.01)
(52) U.S. Cl. ........................ 716/119; 716/118
(58) Field of Classification Search .................. 716/100, 716/115, 118, 119, 120, 122, 127
See application file for complete search history.

(56) References Cited

U.S. PATENT DOCUMENTS

| | | | | |
|---|---|---|---|---|
| 3,621,347 A | * | 11/1971 | Van Nielen | 257/296 |
| 6,536,028 B1 | * | 3/2003 | Katsioulas et al. | 716/125 |
| 7,227,200 B2 | | 6/2007 | Jin | |
| 7,227,211 B2 | | 6/2007 | Tsutsumi et al. | |
| 7,600,208 B1 | * | 10/2009 | Sharma et al. | 716/120 |
| 2004/0062011 A1 | | 4/2004 | Kinoshita | |
| 2005/0122755 A1 | | 6/2005 | Tsutsumi et al. | |
| 2006/0071241 A1 | | 4/2006 | Jin | |

FOREIGN PATENT DOCUMENTS

| | | |
|---|---|---|
| JP | 2005-116587 A | 4/2005 |
| JP | 2005175003 | 6/2005 |
| KR | 10-1999-0055769 | 7/1999 |
| KR | 10-0574987 | 4/2006 |

* cited by examiner

*Primary Examiner* — Vuthe Siek

(74) *Attorney, Agent, or Firm* — Onello & Mello, LLP

(57) ABSTRACT

A semiconductor device and a layout method of a decoupling capacitor thereof are disclosed. The semiconductor device includes a main power/ground voltage voltage supplying line arranged in a first direction; a plurality of decoupling capacitor cells to reduce power noise generated by the power voltage and the ground voltage in the first direction and in a second direction; a plurality of sub power voltage supplying lines arranged in the second direction in a border of the plurality of decoupling capacitor cells; and a plurality of sub ground voltage supplying lines arranged in a net form in the border of the plurality of decoupling capacitor cells, wherein the plurality of decoupling capacitor cells have a first active region arranged to receive the ground voltage and the second active region disposed to receive the power voltage and to avoid a region where an inversion is formed in the decoupling capacitor.

17 Claims, 9 Drawing Sheets

SEMICONDUCTOR DEVICE AND LAYOUT METHOD OF DECOUPLING CAPACITOR THEREOF

CROSS-REFERENCE TO RELATED APPLICATION

This application claims the benefit of priority to Korean Patent Application No. 10-2007-0018441, filed Feb. 23, 2007, the disclosure of which is hereby incorporated herein by reference in its entirety.

BACKGROUND OF THE INVENTION

1. Field of the Invention

The present invention relates to a semiconductor device, and more particularly, to a semiconductor device in which noise of power voltage and ground voltage lines is prevented, thereby supplying a stable power voltage to an internal circuit, and a layout method of a decoupling a capacitor thereof.

2. Description of the Related Art

To satisfy high performance and high speed operation requirements of an electronic device system, a semiconductor integrated circuit becomes more complicated in configuration, and an operation speed of the semiconductor integrated circuit becomes faster. As a circuit for constituting a semiconductor device is complicated, parasite capacitance, inductance and resistance are increased, and so measures for noise of power voltage and ground voltage lines to supply a stable power voltage to an internal circuit of a semiconductor device become an important issue.

One conventional measure for noise of the power voltage and ground voltage lines is a method for installing a capacitor, called a decoupling capacitor, between the power voltage line and an internal circuit, e.g., driver circuit to use the capacitor as a temporary current source. That is, the decoupling capacitor supplies the internal circuit with a transient large current necessary when a clock of the internal circuit transitions from one state to the other state, so that abrupt flow of the electric current to the internal circuit from a power supply is prevented, thereby preventing noise induced to the power voltage line and a voltage drop.

Meanwhile, high integration of a semiconductor device has been advanced by a photolithography technique. The photolithography is a process for shifting a pattern of a geometrical shape on a mask onto a thin layer of a photo sensitive material, i.e., photo resist which covers a semiconductor wafer surface.

High integration of a semiconductor device has been also advanced by an etching technique (e.g., plasma technique and reactive ion etching (RIE) technique). The etching technique has a disadvantage in that charges which cause a defect of a gate insulating layer are accumulated in a floated gate and so a plasma damage phenomenon occurs where a function of the gate insulating layer is seriously degraded, whereby reliability and characteristics of a semiconductor device are degraded due to accumulation of charges.

That is, serious charging damage occurs in the gate insulating layer since high density plasma is used and so a strong electric field is formed between a gate and a substrate of a semiconductor device. In a high density plasma process, particles of a plasma state comprise a neutral atom or molecule which occupies a predetermined percentage, an electron with a negative charge, a cation with a positive charge, and an anion with a negative charge.

Plasma is affected by an externally applied electric field or magnetic field due to the existence of such electric charge particles, and the electric charge particles are connected by electrical force which works between the electric charge particles in addition to a collision between particles in gas, so that a large number of particles move in mass.

A quantitative analyzing method of plasma damage is possible by adding an antenna pattern to a semiconductor device, e.g., a gate of a decoupling capacitor which is a MOS capacitor to accelerate charge reduction of the MOS capacitor and by measuring a characteristic variation of the MOS capacitor. In the plasma process, the antenna pattern serves as a feeler for collecting charges induced during the process, and so it is called an antenna.

At this time, a diode junction for performing an antenna function is used to prevent plasma damage, and electrons which move to a stepped portion of a gate oxide layer are reduced such that one end of the diode junction is connected to a ground voltage and the other end is connected to a gate electrode, and electrons distributed in the gate electrode are grounded.

If the antenna diode junction is not inserted into the decoupling capacitor, the gate oxide layer can be cracked by anions generated in the etching process.

FIG. 1 is a layout diagram illustrating a part of a conventional decoupling capacitor. The decoupling capacitor of FIG. 1 comprises a plurality of active regions 10-1 to 10-A, a plurality of antenna diode junctions 30-1 to 30-C, and a plurality of gate poly layers 20-1 to 20-B.

The plurality of active regions 10-1 to 10-A are arranged in a transverse direction by diffusing an n-type impurity into a p-type semiconductor substrate, and a plurality of antenna diode junctions 30-1 to 30-C are arranged between the plurality of active regions 10-1 to 10-A by diffusing an n-type impurity into portions of the semiconductor substrate where the active regions are not diffused.

The plurality of gate poly layers 20-1 to 20-B are arranged in a longitudinal direction on portions of the semiconductor substrate where the plurality of active regions 10-1 to 10-A are diffused by forming a gate region of a transistor on portions of the semiconductor substrate where the plurality of antenna diode junctions 30-1 to 30-c are not diffused.

FIG. 2 is a layout diagram illustrating a conventional decoupling capacitor for supplying an electrical power to a semiconductor device. The decoupling capacitor of FIG. 2 comprises a plurality of decoupling capacitor cells 40-1 to 40-L, a plurality of sub voltage supplying lines Vdd-1 to Vdd-m and Vss-1 to Vss-n, a plurality of main voltage supplying lines VDD_S and VSS_S, and a plurality of first and second contacts con1 and con2 (see FIG. 3). The plurality of sub voltage supplying lines Vdd-1 to Vdd-m and Vss-1 to Vss-n comprises a plurality of sub power voltage supplying lines Vdd-1 to Vdd-m and a plurality of sub ground voltage supplying lines Vss-1 to Vss-n, which are made of a metallic material. The plurality of main voltage supplying lines VDD_S and VSS_S comprises a main power voltage supplying line VDD_S and a main ground voltage supplying line VSS_S.

The plurality of decoupling capacitor cells 40-1 to 40-L are arranged adjacent to each other and with up-down symmetry and left-right symmetry to prevent abrupt flow of an electric current to an internal circuit of the semiconductor device from a power supply (not shown), thereby preventing noise induced by a power voltage line and a voltage drop.

The plurality of main voltage supplying lines VDD_S and VSS_S arranged such that first metal lines are disposed on left and right sides of a plurality of decoupling capacitor cells 40-1 to 40-L to be electrically connected to a plurality of decoupling capacitor cells 40-1 to 40-L in order to supply a power voltage and a ground voltage from the power supply to the plurality of decoupling capacitor cells 40-1 to 40-L through power pads.

The plurality of sub power voltage supplying lines Vdd-1 to Vdd-m electrically connect the gate poly layers in a plurality of decoupling capacitor cells 40-1 to 40-L to a plurality of main voltage supplying lines VDD_S and VSS_S through the first and second contacts con1 and con2.

Of course, a structure for arranging second metal lines below or above the first metal lines and electrically connecting them through a plurality of third contacts is possible.

FIG. 3 is a layout diagram illustrating one decoupling capacitor cell of the decoupling capacitor of FIG. 2. The decoupling capacitor cell of FIG. 3 comprises the active region 10-1, the two antenna diode junctions 30-1 and 30-2, the gate poly layer 20-2, the sub power voltage supplying line Vdd-2, the sub ground voltage supplying line Vss-1, and the plurality of first and second contacts con1 and con2.

The active region 10-1 is arranged such that an n-type impurity is diffused into a p-type semiconductor substrate, and the two antenna diode junctions 30-1 and 30-2 are arranged such that an n-type impurity is diffused into an upper center of the semiconductor substrate where the active region 10-1 is not diffused.

The gate poly layer 20-2 is arranged such that a gate region of a transistor is formed on a portion of the semiconductor substrate where the two antenna diode junctions 30-1 and 30-2 are not diffused and is stacked in a rectangular shape on a portion of the semiconductor substrate where the active region 10-1 is diffused.

The sub power voltage supplying line Vdd-2 is stacked in a T shape above the gate poly layer 20-2 of the upper center and the two antenna diode junctions 30-1 and 30-2 of the upper left and right sides and is electrically connected to the gate poly layer 20-2 and the antenna diode junctions 30-1 and 30-2 through the plurality of first contacts con1 and the plurality of second contacts con2.

The sub ground voltage supplying line Vss-1 is arranged such that it is stacked in a rectangular shape whose upper portion is cut out (i.e., in a "u" shape) above the active regions 10-1 and its left and right sides are electrically connected to the active regions 10-1 via the plurality of second contacts 2.

FIG. 4 is a cross-sectional view taken along line A-A' of FIG. 3. The p-type semiconductor substrate 5, the two antenna diode junctions 30-1 and 30-2, a gate oxide layer 15, the gate poly layer 20-2, the sub power voltage supplying line Vdd-2, some of the plurality of first and second contacts con1 and con2, and an insulating layer 35 are provided.

FIG. 5 is a cross-sectional view taken along line B-B' of FIG. 3. The p-type semiconductor substrate 5, the two n-type active regions 10-1, the gate oxide layer 15, the gate poly layer 20-2, the sub power voltage supplying line Vdd-2, the sub ground voltage supplying line Vss-1, others of the plurality of second contacts con2, and the insulating layer 35 are provided.

Here, FIG. 5 shows the two n-type active regions 10-1, the sub ground voltage supplying line Vss-1, and the second contacts con2, which are not shown in FIG. 4, and the p-type semiconductor substrate 5, the gate oxide layer 15, the gate poly layer 20-2, and the insulating layer 35 of FIG. 5, which are also shown in FIG. 4, and thus a cross-sectional structure of the decoupling capacitor cell is described below with reference to FIGS. 4 and 5.

In FIG. 4, the two antenna diode junctions 30-1 and 30-2 are n-type impurity diffusing layers and are formed on both upper left and right sides of the p-type semiconductor substrate 5, and the gate poly layer 20-2 is stacked on an upper center of the p-type semiconductor substrate 5 where the antenna diode junctions 30-1 and 30-2 and the n-type active regions 10-1 are not formed.

The gate oxide layer 15 is formed between the gate poly layer 20-2 and the p-type semiconductor substrate 5, and the sub power voltage supplying line Vdd-2 is stacked above the gate poly layer 20-2 and the antenna diode junctions 30-1 and 30-2 and is electrically connected to the gate poly layer 20-2 and the antenna diode junctions 30-1 and 30-2.

In FIG. 5, the two n-type active regions 10-1 are n-type impurity diffusing layers and are formed on upper left and right sides of the p-type semiconductor substrate 5, and the sub ground voltage supplying line Vss-1 is stacked above the two n-type active regions 10-1 and is electrically connected to the two n-type active regions 10-1 via second contacts con2. Here, a plurality of second contacts are used to be distinguished from a plurality of first contacts con1, but the type of contacts used for the first and second contacts can be otherwise identical in a semiconductor device manufacturing process.

A power supplying operation of the conventional decoupling capacitor is described below with reference to FIGS. 1 to 5.

In FIG. 4, the sub power voltage supplying line Vdd-2 is electrically connected to the gate poly layer 20-2 via the plurality of first contacts con1 and is also electrically connected to the two antenna diode junctions 30-1 and 30-2 via the plurality of second contacts con2.

Plasma used in a semiconductor device manufacturing process is generated and maintained by an electric discharge, and such plasma is used in deposition and etching processes of a semiconductor device manufacturing process. In this semiconductor chip structure, the gate oxide layer 15 and the gate poly layer 20-2 can have a stepped portion in a junction portion of field oxides for isolating a semiconductor element.

Due to the shape of the stepped portion of the gate poly layer 20-2, electrons widely distributed in the gate poly layer 20-2 move to the stepped portion to get to the gate oxide layer 15 and get trapped or damaged. As a result, a threshold voltage is shifted, a drain current is reduced, and a lifespan of a gate insulating layer conductance is reduced, whereby it acts as a critical factor for causing an abnormal function of a semiconductor device.

In FIGS. 2 and 3, when the plurality of main voltage supplying lines VDD_S and VSS_S are supplied with a power voltage and a ground voltage through the power pads from a predetermined power supply, the plurality of sub power voltage supplying lines Vdd-1 to Vdd-m and the plurality of sub ground voltage supplying lines Vss-1 to Vss-n, forming a plurality of sub voltage supplying lines, receive the power voltage and the ground voltage and apply them to the plurality of decoupling capacitor cells 40-1 to 40-L.

The plurality of decoupling capacitor cells 40-1 to 40-L are electrically connected to each other, and receive the power voltage and the ground voltage from the plurality of sub voltage supplying lines Vdd-1 to Vdd-m and apply them to adjacent up, down, left and right decoupling capacitor cells through the sub power voltage supplying line Vdd-2, the sub ground voltage supplying line Vss-1, and the gate poly layers 20-1 to 20-B.

That is, the power voltage is transferred to the adjacent left and right decoupling capacitor cells through the sub power voltage supplying lines Vdd-2 and to the adjacent up and down decoupling capacitor cells through the gate poly layers 20-1 to 20-B, whereas the ground voltage is transferred to the adjacent left and right decoupling capacitor cells through the sub ground voltage supplying line Vss-1 to Vss-n. However, the ground voltage is transferred to the adjacent up and down decoupling capacitor cells through a detour using the sub ground voltage supplying lines Vss-1 to Vss-n and the main ground voltage supplying lines VSS_S since the gate poly layers 20-1 to 20-B cannot be used as a medium for transferring the ground voltage to the adjacent up and down decoupling capacitor cells due to insertion of the antenna diode junctions 30-1 to 30-C for preventing a plasma damage phenomenon.

However, if the ground voltage is transferred to the adjacent up and down decoupling capacitor cells through a detour using the sub ground voltage supplying lines Vss-1 to Vss-n and the main ground voltage supplying lines VSS_S as described above, inductance and resistance are increased, resulting in an increment of noise from the ground voltage line, whereby there is a problem in that it is difficult to supply a stable power voltage to the internal circuit of the semiconductor device.

SUMMARY OF THE INVENTION

In accordance with aspects of the present invention, there is provided a semiconductor device in which the ground voltage as well as the power voltage can be transferred directly to the adjacent up, down, left and right decoupling capacitor cells.

In accordance with other aspects of the present invention, there is provided a layout method of a decoupling capacitor of a semiconductor device in which the ground voltage, as well as the power voltage, can be transferred directly to the adjacent up, down, left and right decoupling capacitor cells.

One aspect of the present invention provides a semiconductor device including a decoupling capacitor, the device comprising: a main power voltage supplying line arranged in a first direction and configured to supply a power voltage; a main ground voltage supplying line arranged in the first direction and configured to supply a ground voltage; a plurality of decoupling capacitor cells arranged between the main power voltage supplying line and the main ground voltage supplying line in the first direction and in a second direction perpendicular to the first direction, and configured to reduce power noise generated by the power voltage and the ground voltage; a plurality of sub power voltage supplying lines connected to the main power voltage supplying line and arranged in the second direction in borders of the plurality of decoupling capacitor cells and configured to supply the power voltage to the plurality of decoupling capacitor cells; and a plurality of sub ground voltage supplying lines connected to the main ground voltage supplying line and arranged in a grid form defined by the first and second direction in the border of the plurality of decoupling capacitor cells and configured to supply the ground voltage to the plurality of decoupling capacitor cells, wherein each of the plurality of decoupling capacitor cells has a first active region and a second active region, the first active region disposed to receive the ground voltage, the second active region disposed to receive the power voltage and to avoid a region where an inversion is formed in the decoupling capacitor.

The plurality of decoupling capacitor cells can further comprise a semiconductor substrate having a first conductive type, and a gate poly layer formed on a portion of the semiconductor substrate excluding the first and second active regions, the gate poly layer being electrically insulated from the semiconductor substrate, wherein the first active region is configured to receive the ground voltage from an adjacent sub ground voltage supplying line among the plurality of sub ground voltage supplying lines, and the second active region is arranged to avoid the first active region in a region of the gate poly layer and is configured to receive the power voltage from an adjacent sub power voltage supplying line among the plurality of sub power voltage supplying lines.

The plurality of decoupling capacitor cells can further comprise a plurality of first contacts configured to electrically connect the sub power voltage supplying line and the gate poly layer, and a plurality of second contacts configured to electrically connect the sub power voltage supplying line and the second active region and to electrically connect the sub ground voltage supplying line and the first active region.

The first conductive type can be a p type.

In the plurality of decoupling capacitor cells, when the semiconductor substrate has an n type and the first and second active regions have a p type, the sub ground voltage supplying line can be connected to the gate poly layer, and the sub power voltage supplying line can be connected to the first active region.

In the main power voltage supplying line and the main ground voltage supplying line first metal lines can be formed and electrically connected to the sub power voltage supplying line and the sub ground voltage supplying line via the plurality of first contacts, and second metal lines can be formed above or below the first metal lines and electrically connected to each other via a plurality of third contacts.

A junction of the semiconductor substrate and the second active region can be an antenna diode junction that has one end connected to the ground voltage and the other end connected to the gate poly layer and is configured to reduce electrons moving to a stepped portion of the gate poly layer by grounding electrons distributed in the gate poly layer.

Another aspect of the present invention provides a layout method of a decoupling capacitor of a semiconductor device, comprising: arranging a main power voltage supplying line for supplying a power voltage in a first direction; arranging a plurality of decoupling capacitor cells configured to reduce power noise generated by the power voltage and the ground voltage, between the main power voltage supplying line and the main ground voltage supplying line in the first direction and in a second direction that is perpendicular to the first direction; arranging a plurality of sub power voltage supplying lines in the second direction in a border of the plurality of decoupling capacitor cells arranged in the second direction, the plurality of sub power voltage supplying lines connected to the main power voltage supplying line and configured to supply the power voltage to the plurality of decoupling capacitor cells and; and arranging a plurality of sub ground voltage supplying lines in a grid form defined by the first and second direction in the border of the plurality of decoupling capacitor cells, the plurality of sub ground voltage supplying lines connected to the main ground voltage supplying line to supply the ground voltage to the plurality of decoupling capacitor cells.

Arranging the plurality of decoupling capacitor cells can comprise arranging a first active region for receiving the ground voltage from an adjacent sub ground voltage supplying line among the plurality of decoupling capacitor cells; arranging a second active region for receiving the power voltage from an adjacent sub power voltage supplying line among the plurality of sub power voltage supplying lines; and arranging a gate poly layer formed on a portion of the semiconductor substrate excluding the first and second active regions to be electrically insulated from the semiconductor substrate, wherein the second active region is arranged in a region that avoids the first active region in a region of the gate poly layer and a region where an inversion is formed in a decoupling capacitor due to application of the power voltage and the ground voltage.

The method can include arranging the main power voltage supplying line and the main ground voltage supplying line to transfer the power voltage in the first and second directions through the gate poly layer and to transfer the ground voltage in the first and second directions through the plurality of sub ground voltage supplying lines.

The first conductive type can be a p type and the second conductive type can be an n type.

Arranging the plurality of decoupling capacitor cells can comprise connecting the sub ground voltage supplying line to the gate poly layer and connecting the sub power voltage supplying line to the first active region when the first conductive type is an n type and the second conductive type is a p type.

Arranging the second active region can comprise arranging an antenna diode junction to have one end connected to the ground voltage and another end connected to the gate poly layer and reducing electrons moving to a stepped portion of the gate poly layer by grounding electrons distributed in the gate poly layer as a junction of the semiconductor substrate and the second active region.

Arranging the second active region can comprise connecting the other end of the second active region to the gate poly layer through a plurality of second contacts.

Arranging the main power voltage supplying line and the main ground voltage supplying line can comprise forming first metal lines to be electrically connected to the plurality of sub power voltage supplying lines and the plurality of sub ground voltage supplying lines via the plurality of first contacts, and forming second metal lines above or below the first metal lines to be electrically connected to each other via a plurality of third contacts.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF PREFERRED EMBODIMENTS

Figure 1:
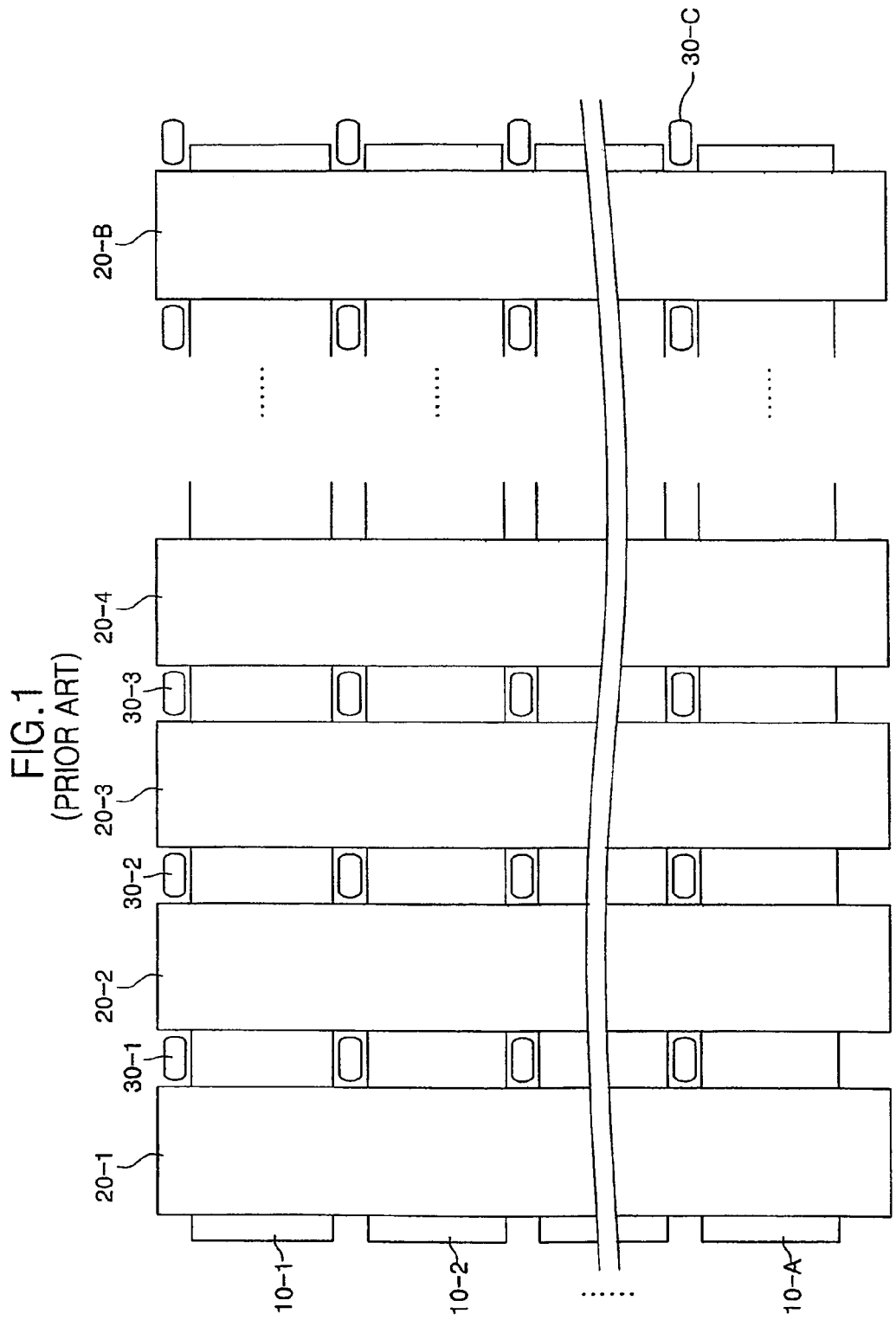
FIG. 1 is a layout diagram illustrating a part of a conventional decoupling capacitor.

Embodiments in accordance with the present invention will now be described more fully hereinafter with reference to the accompanying drawings. The invention can, however, be embodied in different forms and should not be construed as limited to the embodiments set forth herein. In the drawings, the thickness of layers and regions are exaggerated for clarity. Like numbers refer to like elements throughout the specification.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 6:
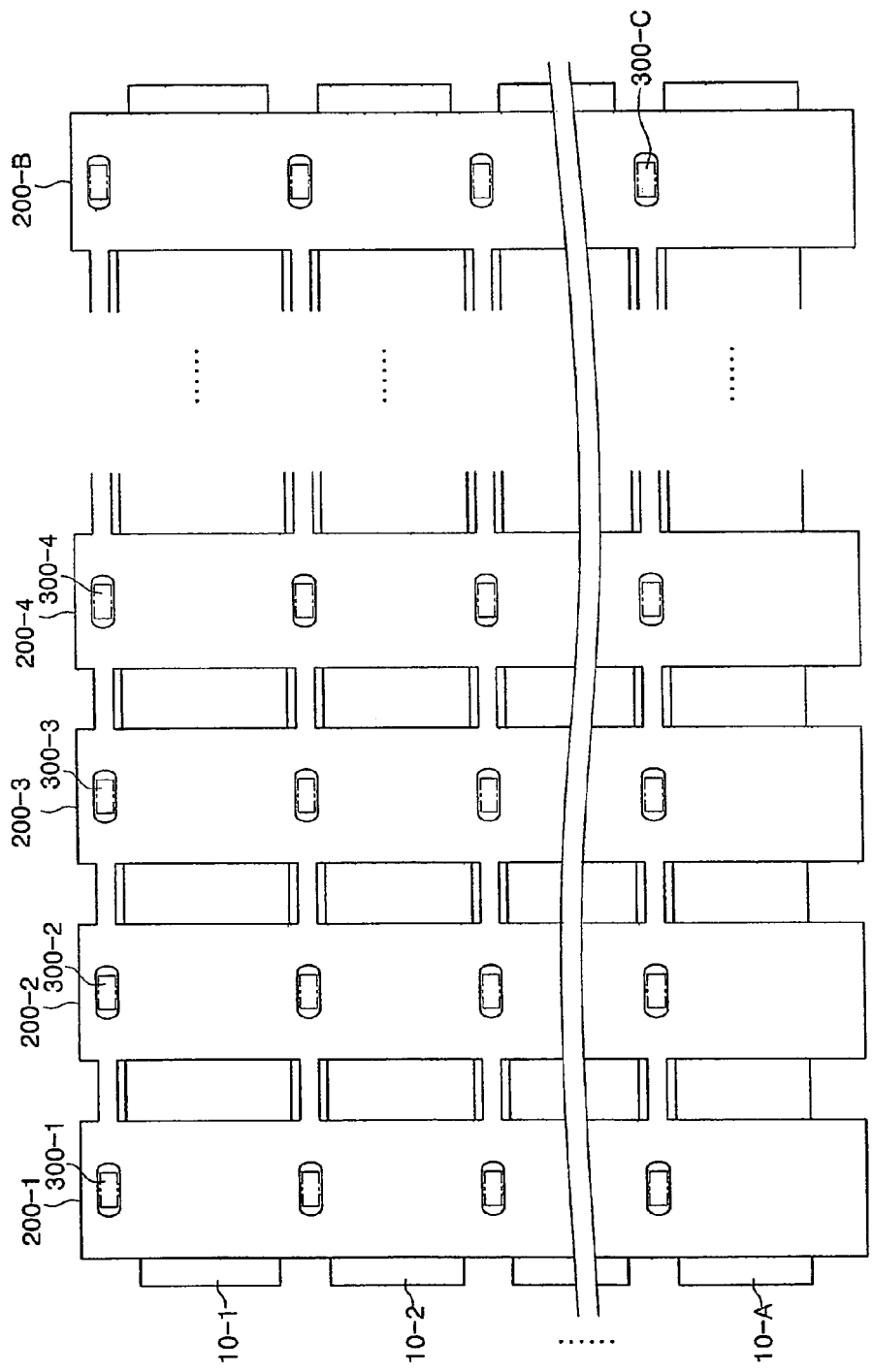
FIG. 6 is a layout diagram illustrating an exemplary embodiment of a part of a decoupling capacitor according to an aspect of the present invention.

FIG. 6 is a layout diagram illustrating an exemplary embodiment of a part of a decoupling capacitor according to an aspect of the present invention. The decoupling capacitor of FIG. 6 comprises a plurality of active regions 10-1 to 10-A, a plurality of antenna diode junctions 300-1 to 300-C, and a plurality of gate poly layers 200-1 to 200-B.

In this embodiment, the plurality of active regions 10-1 to 10-A are arranged in a transverse direction by diffusing an n-type impurity into a p-type semiconductor substrate. The plurality of gate poly layers 200-1 to 200-B are arranged in a longitudinal direction on portions of the semiconductor substrate where the plurality of active regions 10-1 to 10-A are diffused; this is done by forming a gate region of a transistor on portions of the semiconductor substrate where a plurality of antenna diode junctions 300-1 to 300-C are not diffused. The plurality of antenna diode junctions 300-1 to 300-C are arranged between a plurality of active regions 10-1 to 10-A by diffusing an n-type impurity into portions of the semiconductor substrate where the active regions are diffused. This can all be, therefore, as described with respect to corresponding items of FIG. 1, and thus detailed description on in that regard is omitted here for purposes of brevity and clarity.

However, in contrast to the disclosure of FIG. 1, the plurality of gate poly layers 200-1 to 200-B are connected to each other in a transverse direction and have a plurality of holes in central portions below which the plurality of antenna diode junctions 300-1 to 300-C are located.

Figure 7:
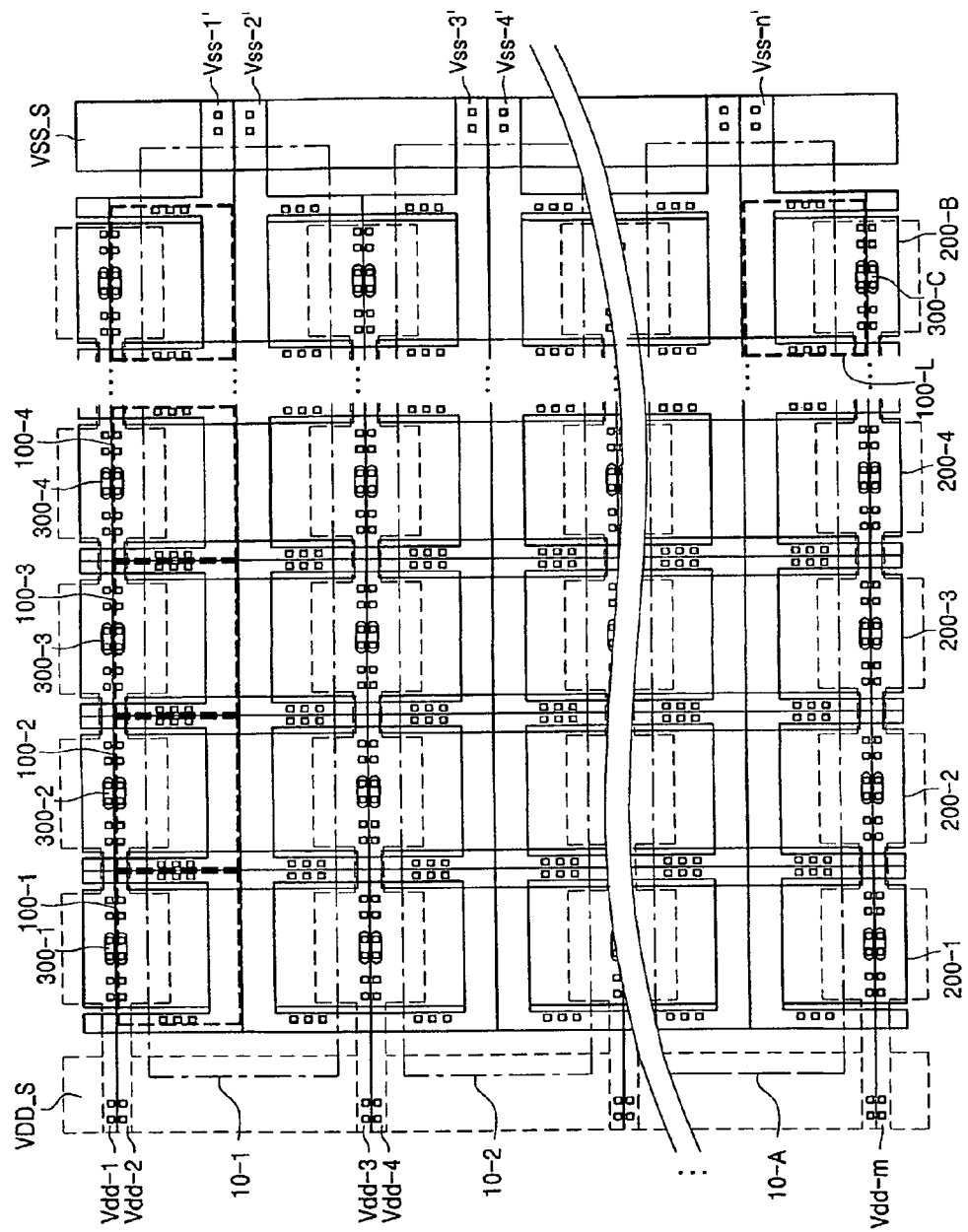
FIG. 7 is a layout diagram illustrating an embodiment of a decoupling capacitor for supplying electrical power to a semiconductor device according to an aspect of the present invention.

FIG. 7 is a layout diagram illustrating an embodiment of a decoupling capacitor for supplying an electrical power to the semiconductor device according to an aspect of the present invention. The decoupling capacitor of FIG. 7 comprises a plurality of decoupling capacitor cells 40-1 to 40-L, a plurality of sub voltage supplying lines Vdd-1 to Vdd-m and Vss-1' to Vss-n', and a plurality of main voltage supplying lines VDD_S and VSS_S. the plurality of sub voltage supplying lines Vdd-1 to Vdd-m and Vss-1' to Vss-n' comprises a plurality of sub power voltage supplying lines Vdd-1 to Vdd-m and a plurality of sub ground voltage supplying lines Vss-1' to Vss-n', which are made of a metallic material in this embodiment. A plurality of main voltage supplying lines VDD_S and VSS_S comprises a main power voltage supplying line VDD_S and a main ground voltage supplying line VSS_S.

Figure 8:
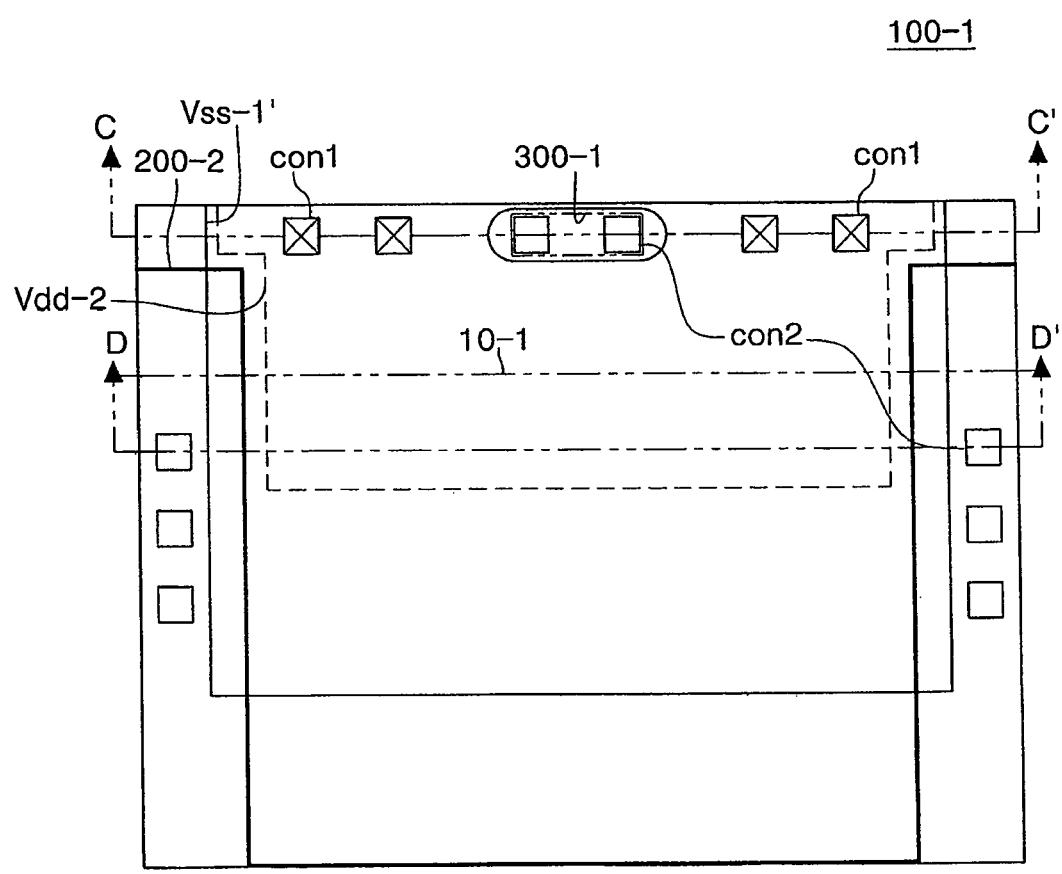
FIG. 8 is a layout diagram illustrating an embodiment of one decoupling capacitor cell of the decoupling capacitor of FIG. 7.

FIG. 8 is a layout diagram illustrating an embodiment of one decoupling capacitor cell of the decoupling capacitor of FIG. 7. The decoupling capacitor cell of FIG. 8 comprises the active region 10-1, the antenna diode junction 300-1, the gate poly layer 200-2, the sub power voltage supplying line Vdd-2, the sub ground voltage supplying line Vss-1', and a plurality of first and second contacts con1 and con2.

Figure 2:
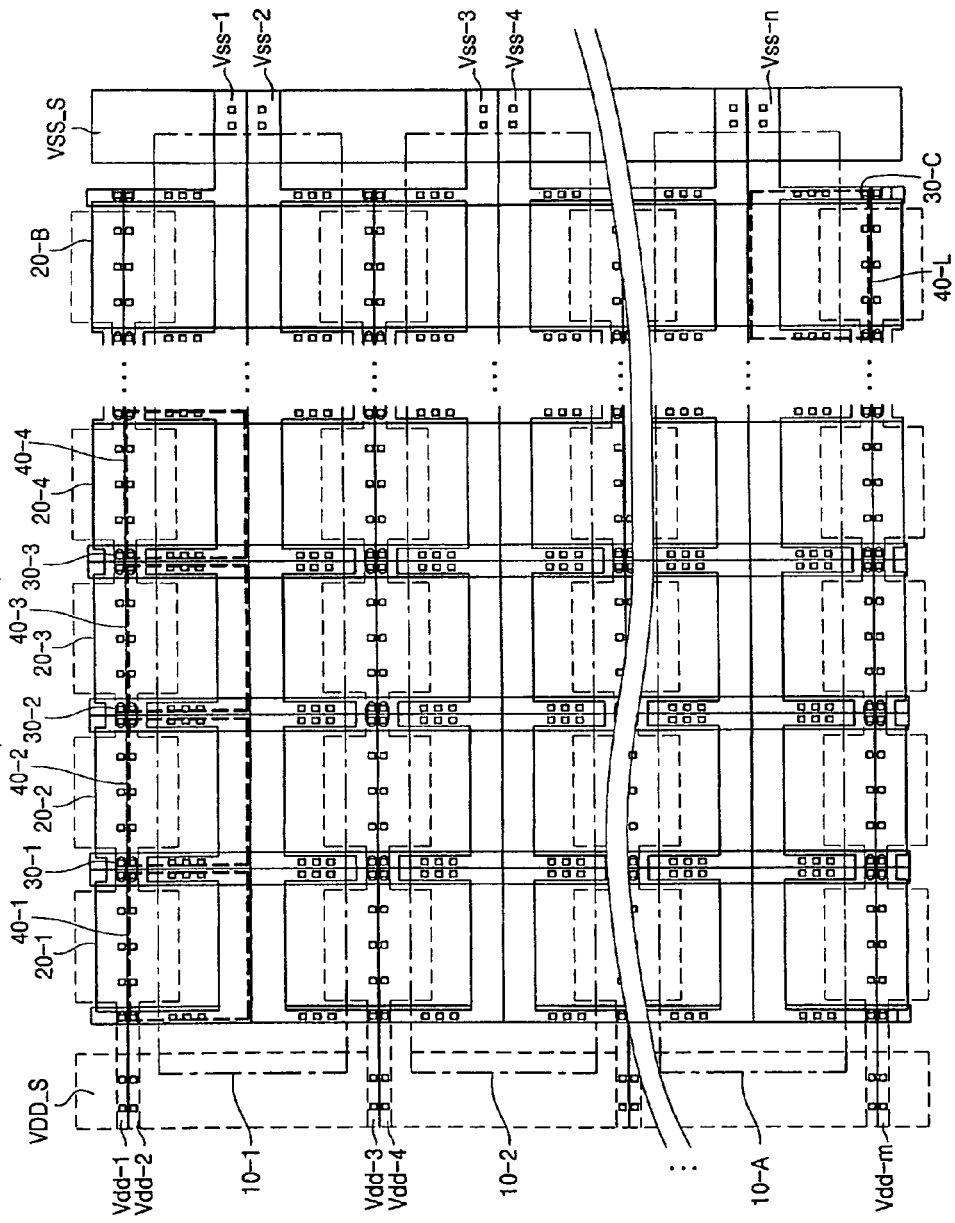
FIG. 2 is a layout diagram illustrating a conventional decoupling capacitor for supplying an electrical power to a semiconductor device.
Figure 3:
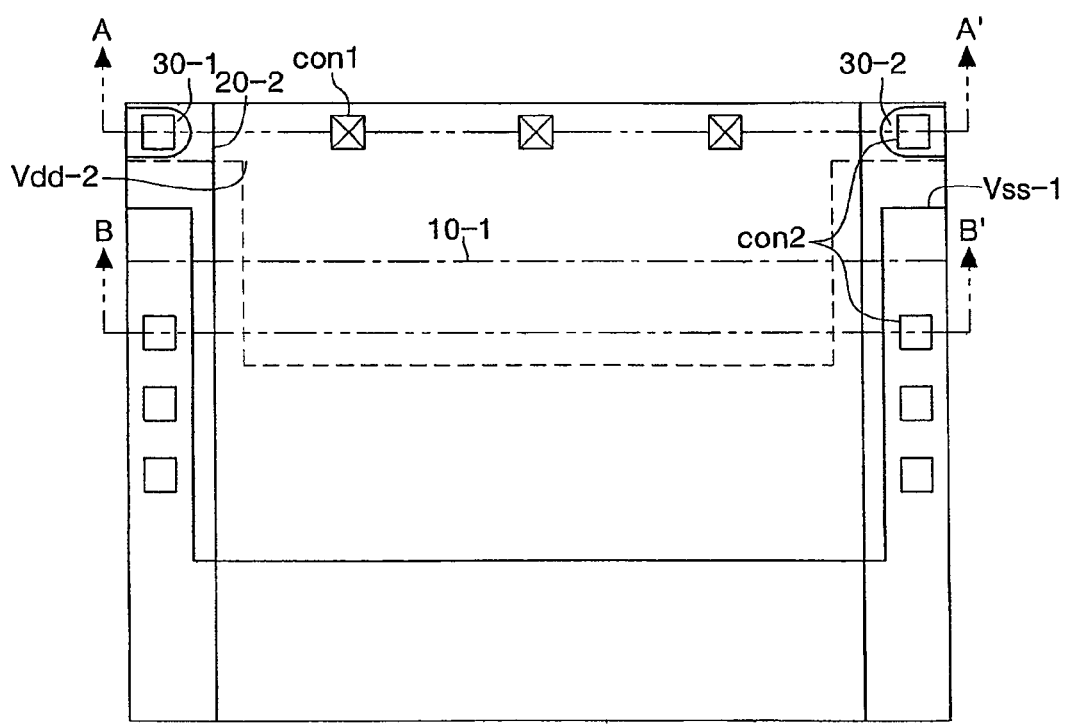
FIG. 3 is a layout diagram illustrating one decoupling capacitor cell of the decoupling capacitor of FIG. 2.

Detailed description on components of the decoupling capacitor in this embodiment that are common to the conventional decoupling capacitor of FIGS. 2 and 3 is omitted. Components that are not common and their relationships are, however, described below.

Referring again to FIG. 7, a plurality of decoupling capacitor cells 100-1 to 100-L are electrically connected to each other and receive the power voltage and the ground voltage from a plurality of sub voltage supplying lines and applies them to adjacent up, down, left, and right decoupling capacitor cells through the sub power voltage supplying is line, the sub ground voltage supplying line, and the gate poly layer.

In case of the power voltage, unlike a plurality of decoupling capacitor cells 40-1 to 40-L of FIG. 2, the power voltage is transferred to the adjacent left and right decoupling capacitor cells as well as the adjacent up and down decoupling capacitor cells through the gate poly layers 200-1 to 200-B, and the ground voltage is transferred to the adjacent up and down decoupling capacitor cells, as well as the adjacent left and right decoupling capacitor cells, through the plurality of sub ground voltage supplying lines Vss-1' and Vss-n'.

Figure 4:
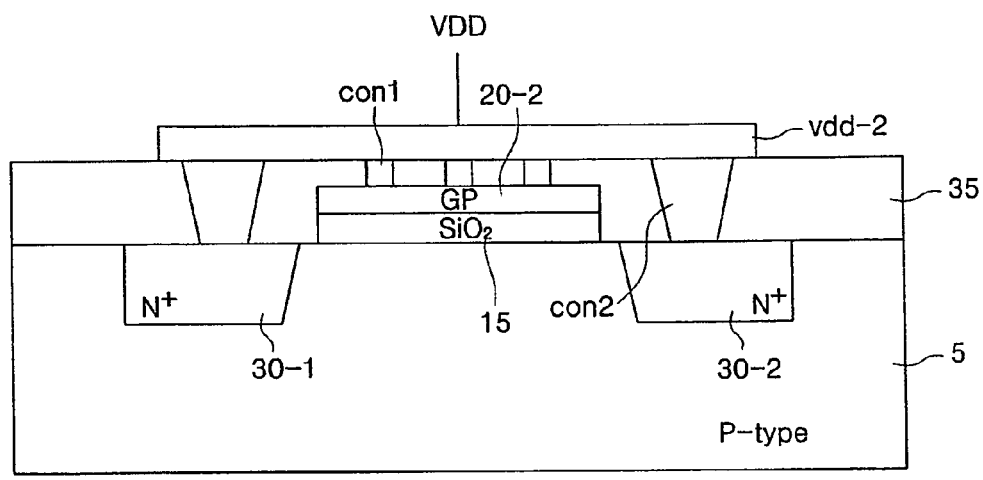
FIG. 4 is a cross-sectional view taken along line A-A' of FIG. 3.

In other embodiments it is possible to arrange the antenna diode junctions 300-1 to 300-C on the semiconductor substrate below the holes formed on the central portions of the gate poly layers 200-1 to 200-B, unlike the structure of the conventional decoupling cell of FIG. 4. The conventional decoupling cell cannot use the gate poly layers 20-1 to 20-B as a mediator when the ground voltage is transferred to the adjacent up and down decoupling capacitor cells since the antenna diode junctions 30-1 to 30-C are inserted on left and right sides of the sub power voltage supplying line Vdd-2.

That is, the sub power voltage supplying line Vdd-2 of FIG. 8, which is formed in a T shape, is electrically connected to one antenna diode junction 300-1, which is an active region on the central portion of the semiconductor substrate, via a plurality of second contacts con2. And the sub power voltage supplying line Vdd-2 of FIG. 8 is also electrically connected to the gate poly layer 200-2 of upper left and right portions via a plurality of first contacts con1. In such an embodiment, the antenna diode junction 300-1 can be arranged on portions of the gate poly layer where it can avoid the first active region.

The sub ground voltage supplying line Vss-1' is formed in a "U" shape (or rectangular shape whose upper portion is cut) and its left and right portions are electrically connected to the active region 10-1 via a plurality of second contacts con2. The sub ground voltage supplying line Vss-1' has a shape where both of its arms extend to a location where the antenna diode junctions 30-1 to 30-C are located in the structure of the conventional decoupling capacitor cell of FIG. 3.

Therefore, the ground voltage can be transferred between the adjacent up and down decoupling capacitor cells 100-1 to 100-L through a plurality of sub ground voltage supplying lines Vss-1' to Vss-n'.

The gate poly layer 200-2 is formed in a T shape having an upper central portion that has a long elliptical hole and is electrically connected to upper left and right portions of the sub power voltage lines Vdd2 via a plurality of first contacts con1.

Therefore, the power voltage can be transmitted between the adjacent left and right decoupling capacitor cells 100-1 to 100-L through the gate poly layers 200-1 to 200-B.

Here, a form of each layer is an exemplary form for an easy electrical connection with a plurality of sub power supplying lines, wherein the present invention is not limited to the above described forms.

That is, in the sub ground voltage supplying line Vss-1', a region of a first metal line of a relatively large area is secured due to a location of the second contact con2 of the active region 10-1 of the semiconductor substrate, but in a case of the sub power voltage supplying line Vdd-2, due to difficulties in a semiconductor device manufacturing process, a location of the first contact con1 for connecting the gate poly layer 200-2 and the first metal line should avoid a region where the gate poly layer 200-2 and the active region 10-1 of the semiconductor substrate overlap.

For this reason, the first contact con1 should be located on a protruding region where the gate poly layer 200-2 and the active region 10-1 of the semiconductor substrate do not overlap. However, if the protruding region is small, the first and second contacts con1 and con2 should be arranged on a small region, so that the number of arranged contacts is reduced, resulting in a large resistance.

For this reason, in order to reduce resistance resulting from the first and second contacts con1 and con2 and to make it easy to connect the first metal line of the power voltage and a second metal line, which can be stacked above or below the first metal line, a portion of the sub ground voltage supplying line Vss-1' having a relatively large area is evacuated to be used for the metal line of the power voltage, thereby forming the above described forms.

Figure 9:
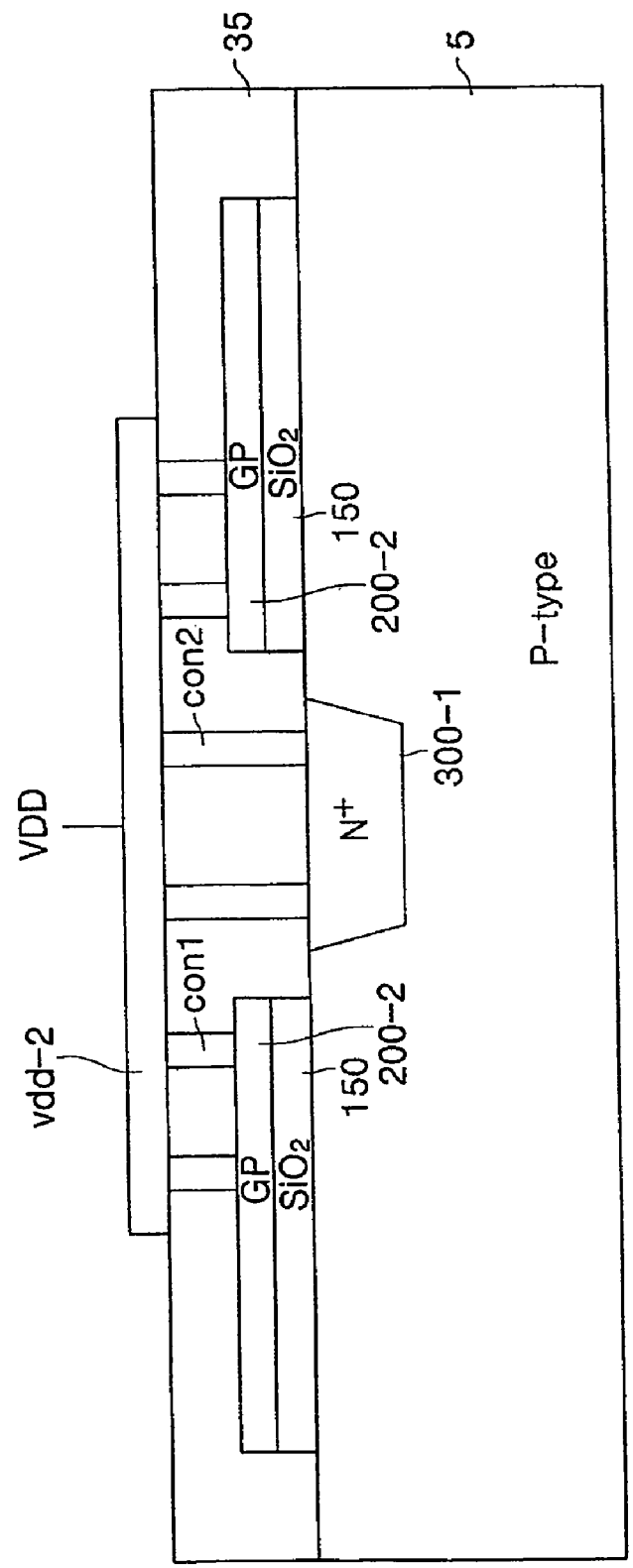
FIG. 9 is a cross-sectional view taken along line C-C' of FIG. 8.

FIG. 9 is a cross-sectional view taken along line C-C' of FIG. 8. The p-type semiconductor substrate 5, the antenna diode junction 300-1, the n-type active region 10-1, a gate oxide layer 150, the gate poly layer 200-2, the sub power voltage supplying line Vdd-2, the sub ground voltage supplying line Vss-1', some of the plurality of first and second contacts con1 and con2, and an insulating layer 35 are provided.

Figure 10:
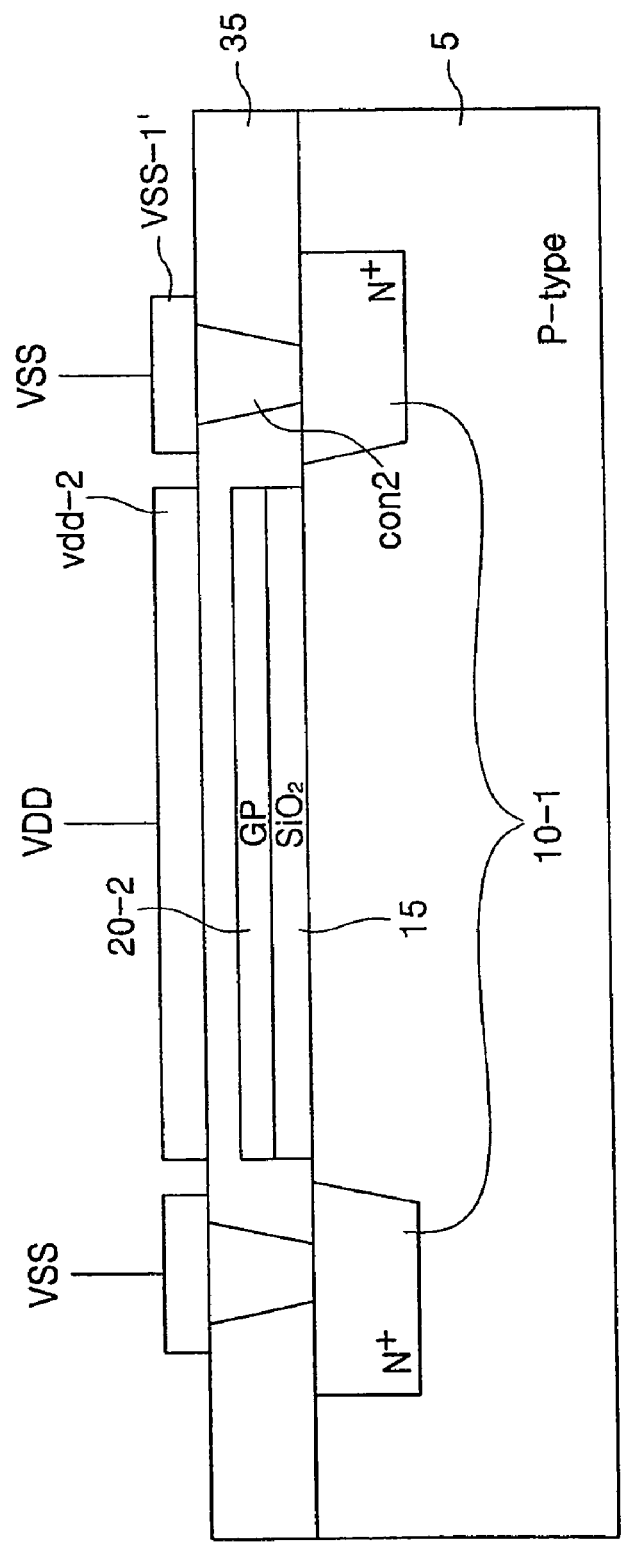
FIG. 10 is a cross-sectional view taken along line D-D' of FIG. 8.

FIG. 10 is a cross-sectional view taken along line D-D' of FIG. 8. The p-type semiconductor substrate 5, the two n-type active regions 10-1, the gate oxide layer 150, the gate poly layer 200-2, the sub power voltage supplying line Vdd-2, the sub ground voltage supplying line Vss-1, others of the plurality of second contacts con2, and the insulating layer 35 are provided.

Figure 5:
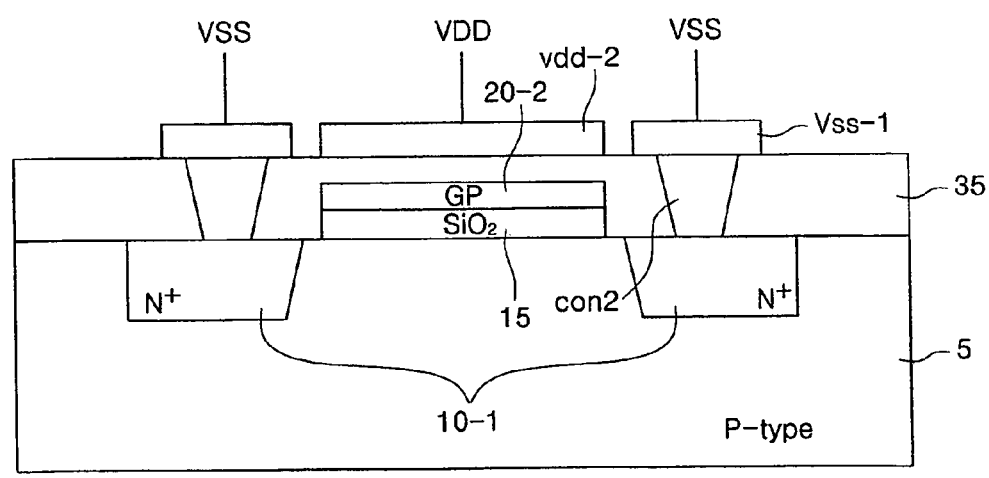
FIG. 5 is a cross-sectional view taken along line B-B' of FIG. 3.

Here, FIG. 10 shows the two n-type active regions 10-1, the sub ground voltage supplying line Vss-1, and some of the plurality of second contacts con2 which are not shown in FIG. 9, and the p-type semiconductor substrate 5, the gate oxide layer 15, the gate poly layer 20-2, and the insulating layer 35 of FIG. 5 are also shown in FIG. 9, and thus a cross-sectional structure of the decoupling capacitor cell is described below with reference to FIGS. 9 and 10.

The antenna diode junction layer 300-1 is an n-type impurity diffusing layer and is formed on an upper central portion of the p-type semiconductor substrate 5. The gate poly layer 200-2 is stacked on left and right sides of the upper central portion of the p-type semiconductor substrate 5 in which the antenna diode junction layer 300-1 is not formed, to avoid a region where an inversion is formed in the decoupling capacitor due to application of the power voltage and the ground voltage.

The oxide layer 150 is formed between the gate poly layer 200-2 and the p-type semiconductor substrate 5, and the sub power voltage supplying line Vdd-2 is electrically connected to the gate poly layer 200-2 via first contacts con1 and connected to the antenna diode junction layer 300-1 via second contacts con2. The sub ground voltage supplying line Vss-1' is electrically connected to the active region 10-1 of the semiconductor substrate 5 excluding the antenna diode junction layer 300-1 via second contacts con2.

In FIG. 9, the sub ground voltage supplying line Vss-1' is electrically connected to the n-type active regions 10-1 of the left and right sides of the semiconductor via second contacts con2, so that the adjacent decoupling capacitor cells 100-1 to 100-L are connected to each other to thereby transfer the ground voltage to the adjacent up and down decoupling capacitors 100-1 to 100-L, as with the layout of the decoupling capacitor cell of FIG. 5.

The gate poly layer 200-2 has the central hole below which the antenna diode junction 300-1 and is electrically connected to the sub power voltage supplying line Vdd-2 via first contacts con1, so that the adjacent decoupling capacitor cells 100-1 to 100-L are connected to each other to thereby transfer the power voltage to the adjacent left and down decoupling capacitors 100-1 to 100-L.

Here the first metal line Vss-1' for transferring the ground voltage is electrically connected to the active region 10-1 of the semiconductor substrate via the second contacts con2 and is not connected to the gate poly layer 200-2. The ground voltage can be applied only to an NMOS decoupling capacitor, and in case of a PMOS decoupling capacitor, the first metal line Vss-1' for the ground voltage can be connected to the gate poly layer 200-2, and the first metal line Vdd-2 for the power voltage can be connected to the active region 10-1 of the semiconductor substrate.

Accordingly, as shown in FIG. 7, the whole layout of the decoupling capacitor for supplying the power voltage to the semiconductor device according to aspects of the present invention does not need to transfer the ground voltage between the adjacent up and down decoupling capacitor cells through the detour using the sub ground voltage supplying lines and the ground voltage supplying lines—like the conventional art. Rather, the decoupling capacitor transfers the ground voltage directly to the adjacent up and down decoupling capacitor cells, thereby preventing inductance and resistance of the sub ground voltage supplying lines and the ground voltage supplying lines from being increased. As a result, noise from the ground voltage line is reduced, and a stable power voltage can be supplied to the internal circuit of the semiconductor device.

As described above, a semiconductor device and the layout method using a decoupling capacitor according to aspects of the present invention, do not need to transfer the ground voltage between the adjacent up and down decoupling capacitor cells through the detour using sub ground voltage supplying lines and ground voltage supplying lines—like the conventional art. It is possible to substantially prevent inductance and resistance of the sub ground voltage supplying lines and the ground voltage supplying lines from being increased, whereby noise from the ground voltage line is reduced, and a stable power voltage can be supplied to the internal circuit of the semiconductor device.

What is claimed is:

1. A semiconductor device including a decoupling capacitor, the device comprising:
    a main power voltage supplying line arranged in a first direction and configured to supply a power voltage;
    a main ground voltage supplying line arranged in the first direction and configured to supply a ground voltage;
    a plurality of decoupling capacitor cells arranged between the main power voltage supplying line and the main ground voltage supplying line in the first direction and in a second direction perpendicular to the first direction, and configured to reduce power noise generated by the power voltage and the ground voltage;
    a plurality of sub power voltage supplying lines connected to the main power voltage supplying line and arranged in the second direction in borders of the plurality of decoupling capacitor cells and configured to supply the power voltage to the plurality of decoupling capacitor cells; and
    a plurality of sub ground voltage supplying lines connected to the main ground voltage supplying line and arranged in a grid form defined by the first and second directions in the borders of the plurality of decoupling capacitor cells and configured to supply the ground voltage to the plurality of decoupling capacitor cells,
    wherein each of the plurality of decoupling capacitor cells has a first active region and a second active region, the first active region disposed to receive the ground voltage, the second active region disposed to receive the power voltage and to avoid a region where an inversion is formed in the decoupling capacitor, wherein the plurality of decoupling capacitor cells further comprises:
        a semiconductor substrate having a first conductive type; and
        a gate poly layer formed on a portion of the semiconductor substrate excluding the first and second active regions, the gate poly layer being electrically insulated from the semiconductor substrate,
        wherein the first active region is configured to receive the ground voltage from an adjacent sub ground voltage supplying line among the plurality of sub ground voltage supplying lines, and the second active region is arranged to avoid the first active region and the gate poly layer region and is configured to receive the power voltage from an adjacent sub power voltage supplying line among the plurality of sub power voltage supplying lines.

2. The semiconductor device of claim 1, wherein the plurality of decoupling capacitor cells further comprises:
a plurality of first contacts configured to electrically connect the sub power voltage supplying line and the gate poly layer; and
a plurality of second contacts configured to electrically connect the sub power voltage supplying line and the second active region and to electrically connect the sub ground voltage supplying line and the first active region.

3. The semiconductor device of claim 2, wherein in the plurality of decoupling capacitor cells, when the semiconductor substrate has an n type and the first and second active regions have a p type, the sub ground voltage supplying line is connected to the gate poly layer, and the sub power voltage supplying line is connected to the first active region.

4. The semiconductor device of claim 3, wherein the main power voltage supplying line and the main ground voltage supplying line first metal lines are formed and electrically connected to the sub power voltage supplying line and the sub ground voltage supplying line via the plurality of first contacts, and second metal lines are formed above or below the first metal lines and electrically connected to each other via a plurality of third contacts.

5. The semiconductor device of claim 1, wherein the first conductive type is a p type.

6. The semiconductor device of claim 5, wherein a junction of the semiconductor substrate and the second active region is an antenna diode junction that has one end connected to the ground voltage and the other end connected to the gate poly layer and is configured to reduce electrons moving to a stepped portion of the gate poly layer by grounding electrons distributed in the gate poly layer.

7. A method of forming a decoupling capacitor in a semiconductor device, the method comprising:
forming a main power voltage supplying line for supplying a power voltage in a first direction within the semiconductor device;
forming a main ground voltage supplying line for supplying a ground voltage in a first direction within the semiconductor device;
forming a plurality of decoupling capacitor cells within the semiconductor device configured to reduce power noise generated by the power voltage and the ground voltage between the main power voltage supplying line and the main ground voltage supplying line in the first direction and in a second direction that is perpendicular to the first direction;
forming a plurality of sub power voltage supplying lines within the semiconductor device in the second direction in a border of the plurality of decoupling capacitor cells arranged in the second direction, the plurality of sub power voltage supplying lines connected to the main power voltage supplying line and configured to supply the power voltage to the plurality of decoupling capacitor cells and; and
forming a plurality of sub ground voltage supplying lines within the semiconductor device in a grid form defined by the first and second directions in the border of the plurality of decoupling capacitor cells, the plurality of sub ground voltage supplying lines connected to the main ground voltage supplying line to supply the ground voltage to the plurality of decoupling capacitor cells, wherein forming the plurality of decoupling capacitor cells comprises:

arranging a first active region for receiving the ground voltage from an adjacent sub ground voltage supplying line among the plurality of decoupling capacitor cells;
arranging a second active region for receiving the power voltage from an adjacent sub power voltage supplying line among the plurality of sub power voltage supplying lines; and
arranging a gate poly layer formed on a portion of the semiconductor substrate excluding the first and second active regions to be electrically insulated from the semiconductor substrate,
wherein the second active region is arranged in a region that avoids the first active region in a region of the gate poly layer and a region where an inversion is formed in a decoupling capacitor due to application of the power voltage and the ground voltage.

8. The method of claim 7, further comprising arranging the main power voltage supplying line and the main ground voltage supplying line to transfer the power voltage in the first and second directions through the gate poly layer and to transfer the ground voltage in the first and second directions through the plurality of sub ground voltage supplying lines.

9. The method of claim 7, wherein the first conductive type is a p type and the second conductive type is an n type.

10. The method of claim 7, wherein providing the plurality of decoupling capacitor cells comprises connecting the sub ground voltage supplying line to the gate poly layer and connecting the sub power voltage supplying line to the first active region when the first conductive type is an n type and the second conductive type is a p type.

11. The method of claim 7, wherein arranging the second active region comprises arranging an antenna diode junction to have one end connected to the ground voltage and another end connected to the gate poly layer and reducing electrons moving to a stepped portion of the gate poly layer by grounding electrons distributed in the gate poly layer as a junction of the semiconductor substrate and the second active region.

12. The method of claim 11, wherein arranging the second active region comprises connecting the other end of the second active region to the gate poly layer through a plurality of second contacts.

13. The method of claim 7, wherein providing the main power voltage supplying line and the main ground voltage supplying line comprises forming first metal lines to be electrically connected to the plurality of sub power voltage supplying lines and the plurality of sub ground voltage supplying lines via the plurality of first contacts, and forming second metal lines above or below the first metal lines to be electrically connected to each other via a plurality of third contacts.

14. A semiconductor device including at least one decoupling capacitor, the device comprising:
a main power voltage supplying line and a main ground voltage supplying line, each arranged in parallel in a first direction;
a plurality of active regions arranged in a second direction between the main power voltage supplying line and the main ground voltage supplying line;
a plurality of gate poly layers arranged in the first direction between the main power voltage supplying line and the main ground voltage supplying line, wherein a plurality of decoupling capacitor cells are formed at intersections of the gate poly layers and the active regions, each of the plurality of decoupling capacitor cells including an antenna diode junction disposed beneath a hole formed in a corresponding one of the gate poly layers;

a plurality of sub power voltage supplying lines connected to the main power voltage supplying line and arranged in the second direction in borders of the plurality of decoupling capacitor cells; and a plurality of sub ground voltage supplying lines connected to the main ground voltage supplying line and arranged in the first and second directions in the borders of the plurality of decoupling capacitor cells, wherein each of the plurality of decoupling capacitor cells has a first active region and a second active region, the first active region disposed to receive the ground voltage, the second active region disposed to receive the power voltage and to avoid a region where an inversion is formed in the decoupling capacitor.

15. The semiconductor device of claim 14, wherein the plurality of decoupling capacitor cells further comprises:

a semiconductor substrate having a first conductive type; and each of the gate poly layers is formed on a portion of the semiconductor substrate, and is electrically insulated from the semiconductor substrate.

16. The semiconductor device of claim 15, wherein the first conductive type is a p type.

17. The semiconductor device of claim 14, wherein a junction of the semiconductor substrate and the second active region is an antenna diode junction that has one end connected to the ground voltage and the other end connected to the gate poly layer and is configured to reduce electrons moving to a stepped portion of the gate poly layer by grounding electrons distributed in the gate poly layer.

* * * * *